(12) United States Patent
Honmura

(10) Patent No.: US 7,260,669 B2
(45) Date of Patent: Aug. 21, 2007

(54) SEMICONDUCTOR INTEGRATED CIRCUITS

(75) Inventor: Tetsuroo Honmura, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 119 days.

(21) Appl. No.: 10/603,797

(22) Filed: Jun. 26, 2003

(65) Prior Publication Data

US 2004/0044968 A1 Mar. 4, 2004

(30) Foreign Application Priority Data

Aug. 28, 2002 (JP) .......................... P2002-247969

(51) Int. Cl.
*G06F 12/00* (2006.01)
*G06F 12/10* (2006.01)
*G06F 13/00* (2006.01)
*G06F 13/38* (2006.01)

(52) U.S. Cl. .............................. 711/1; 711/2; 711/200; 711/202; 711/203; 711/206; 711/220; 711/221; 710/3; 710/4; 710/8; 710/9; 710/62; 710/63; 710/64; 710/72; 710/73; 710/74; 710/100; 710/104; 710/105; 710/110; 710/305; 710/306; 709/208; 709/209; 709/211

(58) Field of Classification Search ............... 710/2–5, 710/8–11, 13, 14, 36, 37, 62–64, 72–74, 100, 710/104–105, 110, 300–302, 305, 306, 316; 709/208, 209, 211; 711/1–6, 100, 111, 200, 711/202, 203, 206–208, 220, 221; 713/1, 713/2, 100

See application file for complete search history.

(56) References Cited

U.S. PATENT DOCUMENTS

| 4,315,310 | A | * | 2/1982 | Bayliss et al. ............... 710/3 |
| 4,407,016 | A | * | 9/1983 | Bayliss et al. ............... 710/3 |
| 4,648,035 | A | * | 3/1987 | Fava et al. .................. 711/202 |
| 5,349,679 | A | * | 9/1994 | Nakayama ................. 710/316 |
| 5,481,456 | A | * | 1/1996 | Ogura ........................... 701/1 |
| 5,530,818 | A | * | 6/1996 | Tagawa ........................ 711/1 |
| 5,715,419 | A | * | 2/1998 | Szczepanek et al. ....... 711/212 |
| 5,804,750 | A | * | 9/1998 | Shirakawa et al. ......... 84/602 |
| 5,812,867 | A | * | 9/1998 | Basset .......................... 712/1 |
| 5,826,105 | A | * | 10/1998 | Burstein et al. ............ 710/22 |
| 5,894,563 | A | * | 4/1999 | Saperstein ................. 710/305 |
| 6,088,753 | A | * | 7/2000 | Sheafor et al. ............ 710/306 |
| 6,119,192 | A | * | 9/2000 | Kao et al. .................. 710/311 |

(Continued)

OTHER PUBLICATIONS

John Uffenbeck, Microcomputers and Microprocessors: The 8080, 8085, and Z-80 Programming, Interfacing, and Troubleshooting, 1985 by Prentice-Hall, pp. 148-160.*

(Continued)

*Primary Examiner*—Tanh Q. Nguyen
(74) *Attorney, Agent, or Firm*—Antonelli, Terry, Stout & Kraus, LLP.

(57) ABSTRACT

When a peripheral LSI has a memory space which is other than the memory space of a CPU, access is made without one of the memory spaces being aware of the other memory spaces. A flexible bus controller BSC makes address translation according to information on the relation between addresses of both memory spaces. The invention assures wider latitude in CPU type selection and makes it easy to reuse an existing program or develop a new program.

12 Claims, 5 Drawing Sheets

U.S. PATENT DOCUMENTS

| | | | |
|---|---|---|---|
| 6,154,824 A * | 11/2000 | Robertson et al. | 711/202 |
| 6,292,851 B1 * | 9/2001 | Takeda | 710/19 |
| 6,353,863 B1 * | 3/2002 | Nakagawa et al. | 710/5 |
| 6,581,130 B1 * | 6/2003 | Brinkmann et al. | 710/306 |
| 6,618,770 B2 * | 9/2003 | Nayyar et al. | 710/3 |
| 6,748,512 B2 * | 6/2004 | Buch et al. | 711/202 |
| 6,845,496 B2 * | 1/2005 | Honmura | 716/14 |
| 2001/0011214 A1 * | 8/2001 | Shigeki et al. | 703/22 |
| 2001/0011345 A1 * | 8/2001 | Shigeki et al. | 712/226 |
| 2003/0027562 A1 * | 2/2003 | Nishimura | 455/418 |
| 2003/0226044 A1 * | 12/2003 | Cupps et al. | 713/300 |
| 2005/0083744 A1 * | 4/2005 | Arai et al. | 365/202 |

OTHER PUBLICATIONS

M. Morris Mano, "Logic and Computer Design Fundamental", 2000, Prentice Hall, Chapter 11/Input-Output and Communication, 11-3/I/O Interfaces, pp. 580-609.

* cited by examiner

SEMICONDUCTOR INTEGRATED CIRCUITS

CROSS-REFERENCE TO RELATED APPLICATION

This application is related to U.S. application Ser. No. 10/173,661 filed on Jun. 19, 2002, the disclosure of which is hereby incorporated by reference.

BACKGROUND OF THE INVENTION

1. Field of the Invention

The present invention relates to a peripheral LSI in an embedded system of a cellular phone, digital still camera or the like. Here, a peripheral LSI refers to a semiconductor integrated circuit which helps processing by a CPU core.

2. Description of Related Art

In recent years, a semiconductor device called a multi-chip module or system-in-package which combines a CPU core chip and a peripheral LSI chip has been increasingly used. Usually a peripheral LSI in this type of semiconductor device starts operation according to a start instruction which it receives from the CPU core.

The peripheral LSI should transfer data between the CPU core and a peripheral device. As stated on pp.580-609 of "LOGIC AND COMPUTER DESIGN FUNDAMENTALS," M. MORRIS MANO, 2000, PRENTICE HALL, there are three data transfer methods which are used in such circumstances.

The first data transfer method is used in a situation which involves processing of large volumes of data as in video encoding. In this method, the peripheral LSI serves as a bus master for data transfer. The second data transfer method uses the CPU core as a bus master. In the third method, a DMAC (direct memory access controller) connected with the CPU bus serves as a bus master for data transfer. In all these three methods, the whole semiconductor device including the peripheral LSI makes up one CPU core memory space.

SUMMARY OF THE INVENTION

With the recent trend of growing demand for higher functionality in semiconductor devices, the peripheral LSI must handle more and more processing tasks. Therefore, it will be convenient if it is possible to replace only the peripheral LSI in the semiconductor device to change the available functions in the semiconductor device. For the whole semiconductor device to make up one CPU core memory space, the CPU core and peripheral LSI must be combined. However, if the memory space of the CPU core is independent from that of the peripheral LSI, it is also possible to freely combine the independent CPU core and the independent peripheral LSI to make up a semiconductor device.

For this purpose, the memory space of the CPU core and that of the peripheral LSI must be transparent to each other.

Therefore, according to the present invention, areas in the two memory spaces (CPU memory space and peripheral LSI memory space) which should be transparent to each other are predetermined and address information for these areas is previously stored. Preferably, that address information should be stored in a nonvolatile memory of the semiconductor integrated circuits. If a request for access involving both memory spaces arises, addresses in both memory spaces are translated using the address information.

Thus, according to the present invention, it is possible to use a versatile peripheral LSI with various functional modules which is suitable for each system, without any increase in design complexity.

BRIEF DESCRIPTION OF THE DRAWINGS

The invention will be more particularly described with reference to the accompanying drawings, in which.

DETAILED DESCRIPTION OF THE PREFERRED EMBODIMENT

Next, a preferred embodiment of the present invention will be described referring to the accompanying drawings.

Figure 2:
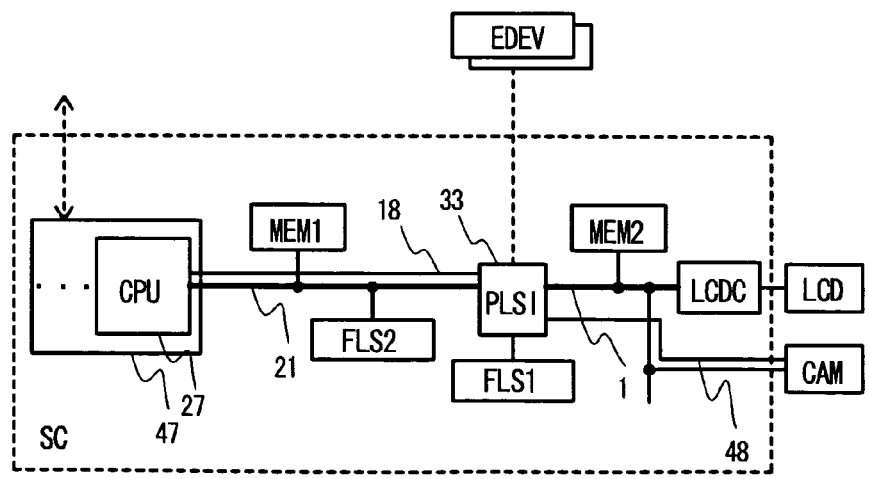
FIG. 2 shows the configuration of a cellular phone (system) which has a semiconductor device including a peripheral LSI according to the present invention.

FIG. 2 schematically shows a semiconductor device SC in a cellular phone as an example. A transmitting/receiving part 47 has a CPU 27. The main purpose of the CPU 27 is to modulate and demodulate data which is received or sent. The CPU 27 is connected with a memory (MEM1), a flash memory (FLS2), and a peripheral LSI (PLSI) 33. The peripheral LSI 33 is connected with an I/O bus 1, and a flash memory (FLS1) the I/O bus is connected with a memory (MEM2), an LCD. controller (LCDC) and a camera (CAM). Thus, a display (LCD) and the camera (CAM) are not directly connected to the CPU bus 21 (system bus) but connected through the peripheral LSI 33. This prevents large volumes of video data before encoding from occupying the CPU bus 21.

The peripheral LSI 33 also uses its internal interface circuit to communicate with an external peripheral device (EDEV)

Given below are five types of data transfer which may occur in the system shown in FIG. 2.

Type 1 data transfer concerns data transfer between the flash memory FLS1 and the peripheral device EDEV. Here, it is the peripheral LSI 33 that serves as a controller LSI which controls this type of data transfer. This is because the flash memory FLS1 and the peripheral device EDEV are connected through the internal interface circuit (functional module) of the peripheral LSI 33. Type 1 data transfer involves the memory space of the peripheral LSI 33.

Type 2 data transfer concerns data transfer between the flash memory FLS2 and the peripheral device EDEV. Here, it is the peripheral LSI 33 that serves as a controller LSI which controls this type of data transfer. This is because the flash memory FLS2 is connected to the CPU bus 21, the interface circuit for the peripheral device EDEV is built in the peripheral LSI 33 and thus both (FLS2 and EDEV) are visible to the peripheral LSI 33. Type 2 data transfer involves both the memory space of the CPU 27 and that of the peripheral LSI 33. If a program for control of the peripheral device EDEV is stored in the program area of the flash memory FLS2, the system sends this program to the peripheral device EDEV to control it.

Type 3 data transfer involves neither data processing as stated later nor the abovementioned data transfer with the peripheral device EDEV. This type of data transfer relates to, for example, a case that the data stored in the memory MEM1 is shown on the LCD. Type 3 data transfer also involves both the memory space of the CPU 27 and that of the peripheral LSI 33. However, unlike Type 2 data transfer, the controller LSI for this type of data transfer is a DMA controller (not shown) connected to the CPU 27 or CPU bus 21. In Type 3 data transfer, the peripheral LSI 33 is only responsible for bus control. Data from the memory MEM1 is sent to the CPU bus 21 and the peripheral LSI 33 sends the data from the CPU bus 21 through the I/O bus 1 to the LCD. For example, Type 3 data transfer is done in order to show a message to notify arrival of an e-mail in the standby mode of a cellular phone.

Data transfer Type 4 and Type 5 relate to system level operation which uses an IP (functional module) for data processing, built in the peripheral LSI 33. The peripheral LSI 33 serves as the controller LSI for both Type 4 and Type 5 of data transfer. Type 4 data transfer and Type 5 data transfer also involve both the memory space of the CPU 27 and that of the peripheral LSI 33.

An example of operation for Type 4 data transfer is a sequence in which received data is processed and the processed data is displayed. After the CPU 27 stores the received data in the memory MEM1, the peripheral LSI 33 sends the data from the memory MEM1 through the CPU bus 21 to the peripheral LSI 33, which then processes the data and sends the processed data through the IO bus 1 to the LCD. One concrete example is video messaging (receiving) where encoded video data is received and decoded by the peripheral LSI 33 for showing on the LCD.

An example of operation for Type 5 data transfer is a sequence in which data entered via a data input device is processed and sent. Video data from the camera (CAM) is loaded via a special purpose data line 48 into the peripheral LSI 33 and processed and sent through the CPU bus 21 to the CPU 27. One concrete example is video messaging (sending) where moving images captured by the camera is encoded by the peripheral LSI 33 and the encoded data is sent.

Next, an explanation will be given of the configuration of the peripheral LSI and its operational sequences for the implementation of the abovementioned data transfers.

(1) Configuration of the Peripheral LSI

Figure 1:
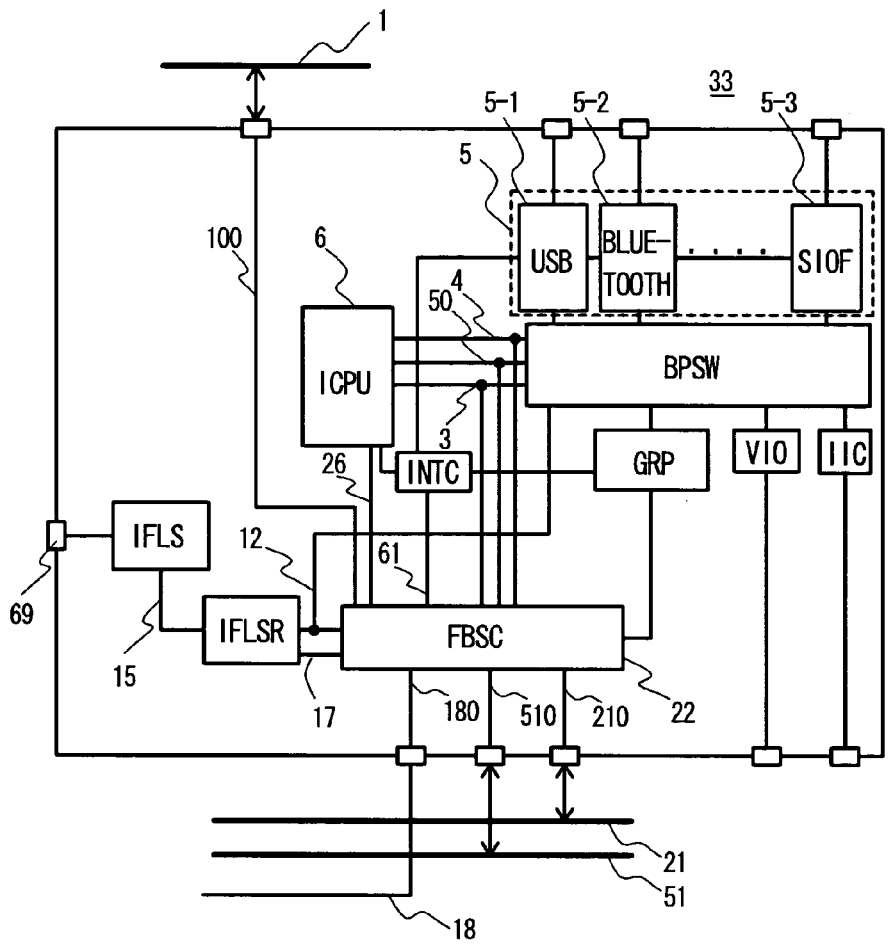
FIG. 1 shows the configuration of a peripheral LSI 33.

FIG. 1 outlines the configuration of the peripheral LSI. The peripheral LSI 33 incorporates a plurality of functional modules. These modules are: CODEC circuits for image encoding and decoding, GRP; a video input/output circuit for large volumes of data communications with a camera or the like, VIO; a two-way serial bus IIC; and an interface circuit group 5 for serial data communications with the peripheral device EDEV. This interface circuit group 5 includes a USB interface circuit 5-1, a Bluetooth interface circuit 5-2 and a serial input/output interface circuit 5-3. The CODEC circuits GRP are application-specific circuits which comply with, for example, MPEG4 protocol. Since the CODEC circuits GRP, video input/output circuit VIO and two-way serial bus IIC have high data transfer rates, they are connected to an internal bus 3 with a high transfer rate, while the interface circuit group 5 is connected to a peripheral bus 4 with a low transfer rate. As will be explained later, the peripheral LSI according to the present invention can select whether or not to use an internal functional module depending on the functionality of a semiconductor device in use. A bus and power switching circuit BPSW is provided for this purpose. It stops power supply to a functional module which is not to be used, and disconnects the bus connection with the module. If no such selection function is provided, the bus and functional modules may be connected directly, or without intermediation of the switching circuit BPSW.

A flexible bus controller FBSC 22 controls data transfer by the peripheral LSI 33. For data transfer which involves both the memory space of the CPU 27 and that of the peripheral LSI 33, the flexible BSC 22 uses address translation information for mapping between the memory space of the CPU 27 and that of the peripheral LSI 33. This address translation information is stored in an on-chip flash memory IFLS through an external pin 69. Memory read circuits IFLSR read the address translation information stored in the on-chip flash memory IFLS and send it to the flexible BSC 22.

Interrupt control circuits INTC receive various interrupt signals which include bus requests from the functional modules.

(2) Internal Operational Sequences of the Peripheral LSI

Internal operational sequences of the peripheral LSI 33 to implement the above five types of data transfer are described below.

(a) Type 1 Data Transfer

A flash interface circuit (not shown, hereinafter referred to as "flash IF") is used as the interface circuit for the flash memory FLS1, and the USB interface circuit 5-1 and the Bluetooth interface circuit 5-2 are used as the interface circuits for the peripheral device EDEV. Since relatively low transfer rates are usable for these interface circuits, not the interface circuits but an on-chip CPU (ICPU) 6 serves as a bus master.

The sequence of data transfer from the flash memory FLS1 to the peripheral device EDEV is as follows. First, data is transferred from the flash memory FLS1 through the flash IF to the peripheral bus 3. Then the data is sent through the flexible BSC 22 to the register of the on-chip CPU 6 (ICPU). The on-chip CPU 6 transfers the data in the register through the flexible BSC 22 to the peripheral bus 3. Lastly, the data on the peripheral bus 3 is transferred through the register of the USB or Bluetooth interface circuit to the peripheral device. The sequence of data transfer from the peripheral device EDEV to the flash memory FLS1 is the reverse of the above.

(b) Type 2 Data Transfer

For the same reason as in the case of Type 1 data transfer, the on-chip CPU 6 serves as a bus master. In data transfer from the flash memory FLS2 to the peripheral device EDEV, data is first sent from the flash memory FLS2 through the CPU bus 21 to the flexible BSC 22, from which the data is then sent to the register of the on-chip CPU6. The subsequent steps for data transfer are the same as in the case of Type 1 data transfer.

(c) Type 3 Data Transfer

In Type 3 data transfer, the peripheral LSI 33 is only responsible for bus control. Data is transferred from the memory MEM1 through the CPU bus 21 to the flexible BSC 22. From the flexible BSC 22, the data is sent through the IO bus 1 and the memory MEM2 to a display control circuit LCDC. The display control circuit LCDC displays the data on the LCD.

(d) Type 4 Data Transfer and Type 5 Data Transfer

In Type 4 data transfer and Type 5 data transfer, the CPU bus 21, IO bus 1 and peripheral LSI 33 are all involved, so the peripheral LSI 33 servers as a controller LSI. The bus master here is a functional module like the CODEC circuits GRP which perform data processing. This is because data transfer without intermediation of the on-chip CPU 6 is more advantageous in order to meet the need for high speed data processing.

The sequence of Type 4 data transfer is explained below, taking an example of video data decoding and display using the CODEC circuits GRP. First, data is transferred from the memory MEM1 through the CPU bus 21 to the flexible BSC 22, from which the data is transferred through the internal bus 4 to the CODEC circuits GRP. Then, the CODEC circuits GRP decode the video data and send the decoded data through the internal bus 4 to the flexible BSC 22. From the flexible BSC 22, the data is sent through the IO bus 1 to the memory MEM2. The subsequent steps are the same as in the case of Type 3 data transfer.

The sequence of Type 5 data transfer is similar to that of Type 4 data transfer. As shown in FIG. 2, either the IO bus 1 or the special purpose data lines 48 may be used for the route of data loading.

(3) Functions of the Flexible BSC 22

The main functions of a bus controller are bus state control and decoding/generation of a bus protocol. Bus state control refers to a process of judging the bus state according to a read/write request from a CPU or other device and decoding or generating a bus protocol. Like a known bus controller, the flexible BSC 22 also has these functions.

The bus controller also generates a protocol to send data to a bus and decodes it to receive data from a bus. When there are a plurality of buses as in the present invention, protocol generation and decoding are done for a bus for sending data and a bus for receiving data, respectively. Particularly in data transfer Types 2 to 5, more than one memory space are involved. Therefore, mapping between memory spaces is made for decoding or generation of a protocol in the flexible BSC and translation of addresses to be mapped must be made. This function enables access to another memory space without a complicated process such as a program modification, thereby reducing the system development cost.

(4) Configuration of the Flexible BSC and its Operation

Figure 3:
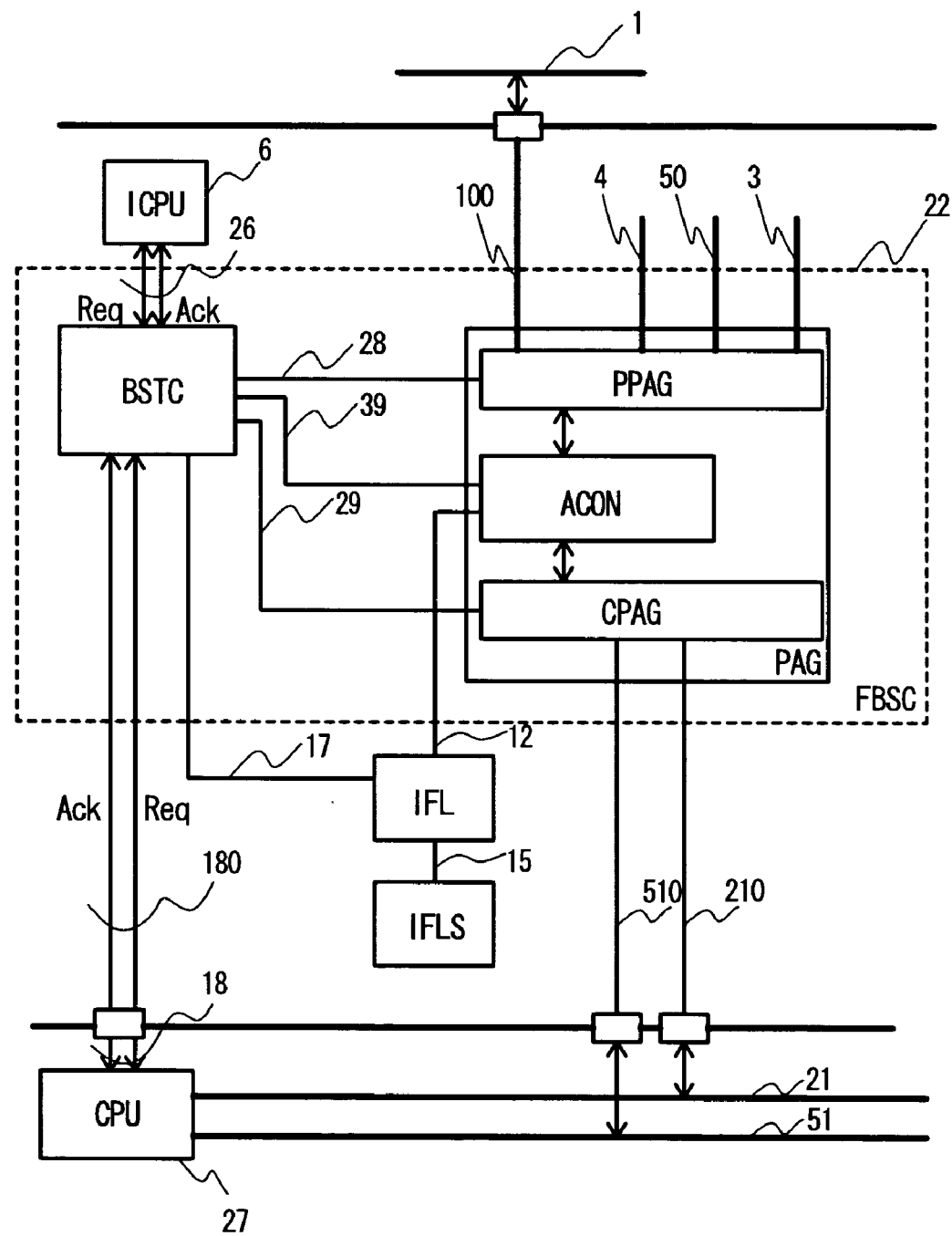
FIG. 3 shows the configuration of a flexible BSC 22.

FIG. 3 shows the configuration of the flexible BSC 22. The flexible BSC 22 has a bus state controller BSTC and protocol decode and generation circuits PAG. The bus state controller BSTC accepts bus requests from a circuit which can be a bus master (for example, the on-chip CPU 6, a functional module such as the CODEC circuits GRP, or the CPU 27) and buses for data transfer and releases the requested bus right in the order of priority. At this time, it changes the bus state and sends information on buses for data transfer to the bus protocol decode and generation circuits PAG. These buses are all buses associated with the flexible BSC 22, namely the CPU bus 21, IO bus 1, internal bus 4 and peripheral bus 3.

As the bus protocol decode and generation circuits PAG receive bus information from the bus state controller BSTC, the circuits decode or generate a protocol and perform address translation of necessary memory spaces.

The bus information which is sent from the bus state controller BSTC to the bus protocol decode and generation circuits PAG includes the following three types of signals: a first bus signal 28 which indicates whether or not it is buss access to the peripheral LSI 33; a second bus signal 39 which indicates whether or not two memory spaces are involved for the bus access; and a third bus signal 29 which indicates whether or not it is CPU bus access. These three types of bus signals are respectively used to control a peripheral LSI protocol decode and generation circuit PPAG, an address translation circuit ACON, and a CPU protocol decode and generation circuit CPAG. The first bus signal 28 becomes active when there occurs access to a bus related to the memory space of the peripheral LSI (IO bus 1, internal bus 4 or peripheral bus 3). The second bus signal 39 becomes active when there occurs access involving both memory spaces. The third bus signal 29 becomes active when there occurs access to a bus unrelated to the memory space of the peripheral LSI (CPU bus 21).

Type 1 data transfer is data transfer which is processed within the memory space of the peripheral LSI. In this case, the first bus signal 28 is active while the second bus signal 39 and the third bus signal 29 are inactive. Data transfer is processed only within one memory space in this way.

In Type 2 data transfer, first, the on-chip CPU 6 issues a bus master request for the CPU bus 21 to the bus state controller BSTC through a control line 26. The bus state controller BSTC issues a bus request Req to the CPU 27 through a control line 18 and receives an acknowledgement Ack. This gives permission for data transfer from the IO bus 1. (or internal bus 4 or peripheral bus 3) to the CPU bus 21. The bus state controller BSTC activates the first bus signal 28 in order to enable the peripheral LSI protocol decode and generation circuit PPAG to obtain data from the IO bus 1. Also address translation is needed to send the transferred data to the peripheral bus 3. Thus, the bus state controller BSTC activates the second bus signal 39 as well. The address translation circuit ACON translates the peripheral LSI memory space address obtained from an address bus 50 into an address for the CPU memory space. The CPU protocol decode and generation circuit CPAG sends the CPU memory space address as a result of translation by the address translation circuit ACON to an address bus 51 and the data to the CPU bus 21.

In Type 3 data transfer, the CPU 27 issues a bus request Req to the bus state controller BSTC through the control line 18 and receives an acknowledgement Ack. This gives permission for data transfer from the CPU bus 21 to the IO bus 1 (or internal bus 4 or peripheral bus 3). The bus state controller BSTC activates the third bus signal 29 in order to enable the CPU protocol decode and generation circuit CPAG to obtain data from the CPU bus 21. Address translation is needed to send the transferred data to the IO bus 1. Thus, the bus state controller BSTC activates the second bus signal 39 as well. The address translation circuit ACON translates the CPU memory space address obtained from the address bus 50 into an address for the peripheral LSI memory space. The peripheral LSI protocol decode and generation circuit PPAG sends the peripheral LSI memory space address as a result of translation by the address translation circuit ACON to the address bus 50 and the data to the IO bus 1.

(5) Configuration of the Address Translation Circuit and its Operation

Figure 4:
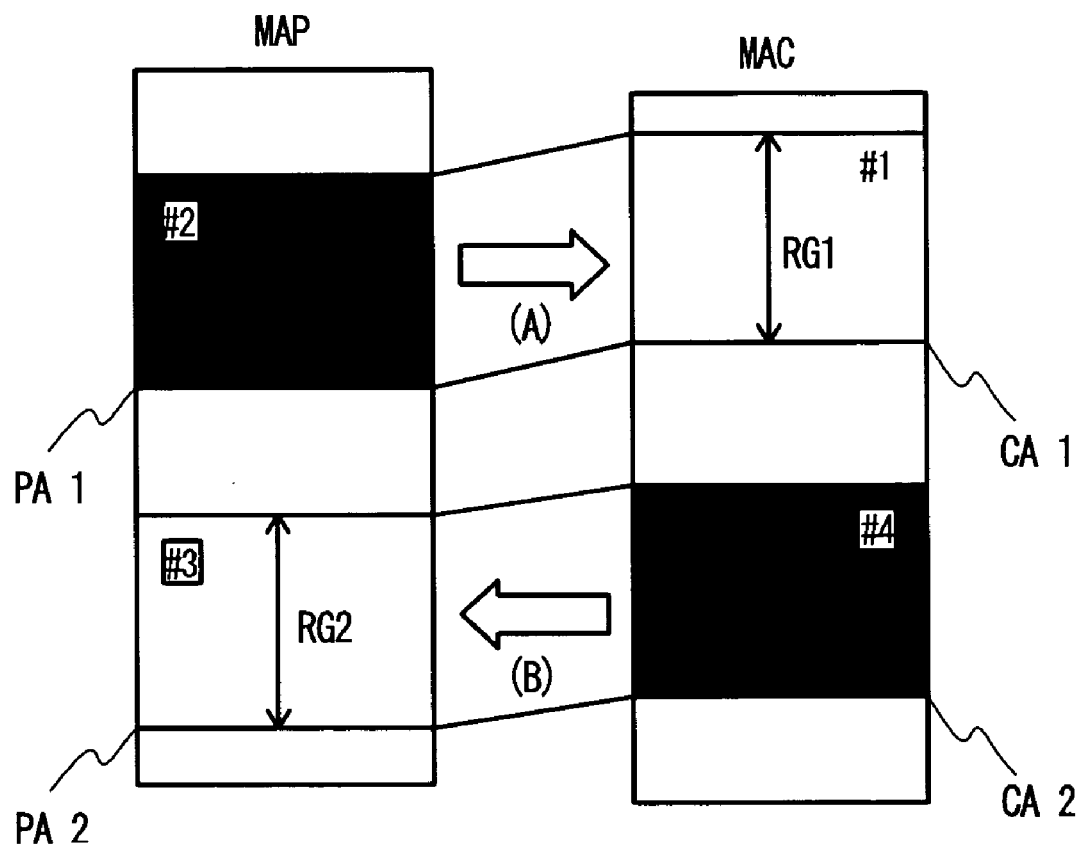
FIG. 4 shows the relationship between a peripheral LSI memory space MAP and a CPU memory space MAC.

FIG. 4 shows address translation for mapping between the peripheral LSI 33 memory space MAP and the CPU 27 memory space MAC. There will be the following two cases: case A in which the peripheral LSI 33 serves as a bus master and access is made to the memory space of the CPU 27; and case B in which the CPU 27 serves as a bus master and access is made to the memory space of the peripheral LSI 33.

In case A, a memory range (second range) in the memory space of the peripheral LSI 33 is allocated to the memory range in the CPU 27 to be accessed (first range). Information necessary for address translation are the start address CA1 in the first range, the start address PA1 corresponding to the start address CA1, and the address width RG1 of the first range.

Case B is opposite to case A. Information necessary for address translation are the start address PA2 in the memory range in the peripheral LSI 33 to be accessed (third range), the start address CA2 in the CPU memory range (fourth range) corresponding to the start address PA2, and the address width RG2 of the third range.

Figure 5:
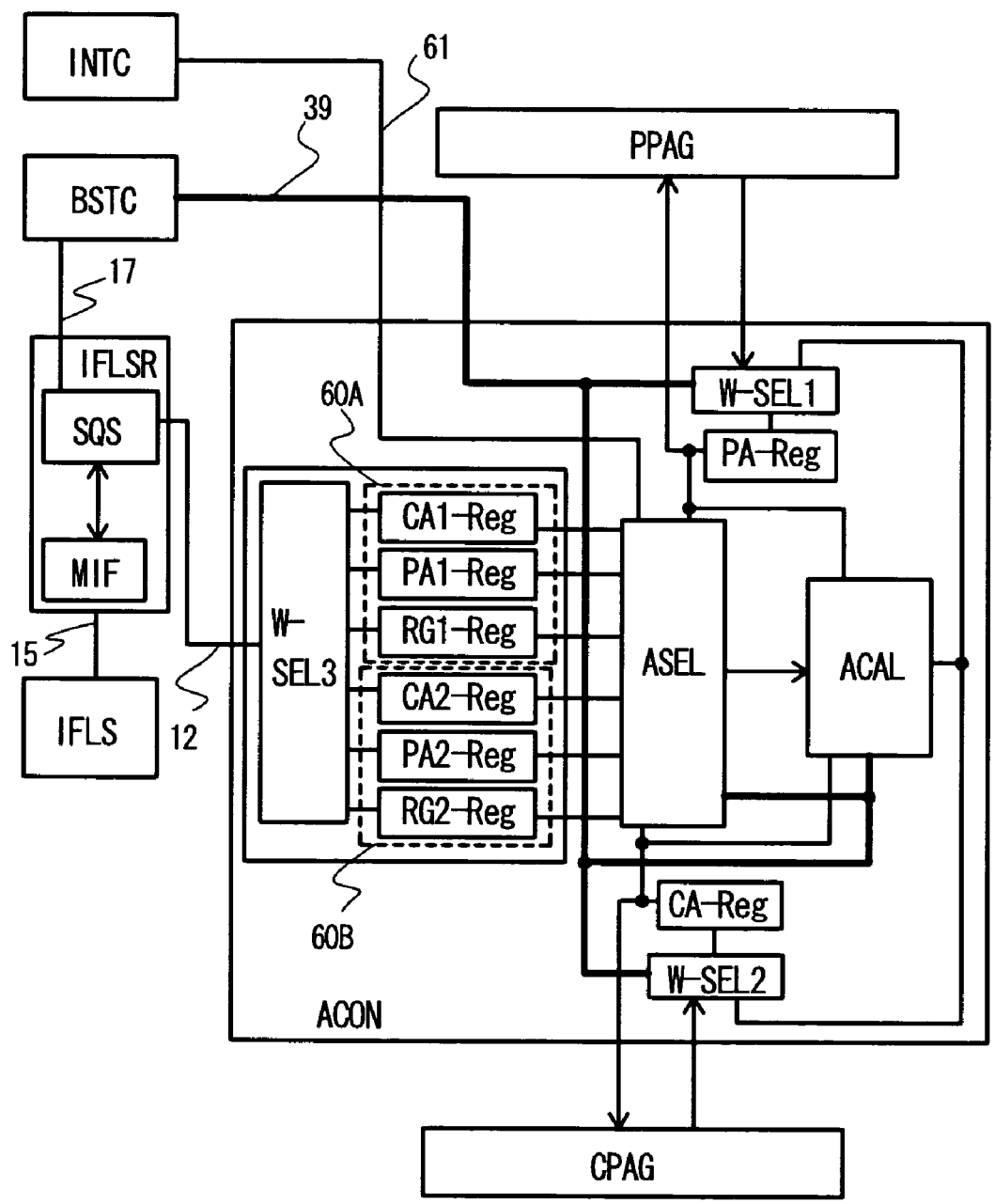
FIG. 5 shows the configuration of an address translation circuit ACON.

The abovementioned address information is stored in the on-chip flash memory IFLS. As the peripheral LSI 33 is initialized, the information is read from the on-chip flash memory IFLS into the registers of the address translation circuit (see FIG. 5). The start address CA1, start address PA1 and address width RG1 are stored in registers CA1-Reg, PA-1-Reg, and RG1-Reg, respectively. Likewise, the start address CA2, start address PA2 and address width RG2 are stored in registers CA2-Reg, PA2-Reg, and RG2-Reg, respectively.

Although there are two different cases that address translation is needed (from the peripheral LSI memory space to the CPU memory space or vice versa), a similar operational sequence is used in both the cases. Therefore, only the case that the peripheral LSI 33 as a bus master accesses the CPU memory space is explained below.

First, the address to be accessed (address in the peripheral LSI memory space MAP which belongs to the second range shown in FIG. 4; here called the "first address") from the peripheral LSI protocol decode and generation circuit PPAG is sent to the address translation circuit ACON. The first address is written through a selector W-SEL1 into a register PA-Reg. In this case, the values of registers CA1-Reg, PA1-Reg, and RG1-Reg are read into an address selection circuit ASEL which decides whether or not the first address written in the register PA-Reg belongs to the second range. If it does not belong to the second range, an error signal 61 is sent to an interrupt circuit INTC. If it belongs to the second range, an address calculation circuit ACAL translates it into an address in the CPU memory space MAC. The new address (here called the "second address") is calculated from the formula: CA1 (address on CA1-Reg)+(address on PA-Reg)−PA1 (address on PA1-Reg). The second address is written through a selector W-SEL2 into a register CA-Reg. The second address written in the register CA-Reg is sent to the CPU protocol decode and generation circuit CPAG.

The same operational sequence as above is used for the case that the CPU 27 serves as a bus master. In this case, however, the new address is calculated from the formula: PA2 (address on PA2-Reg)+(address on CA-Reg)−CA2 (address on CA2-Reg).

(6) Initialization

When the peripheral LSI 33 is initialized, the data in the on-chip flash memory IFLS is read into the register groups 60*a* and 60*b* using a read circuit IFLSR. The read circuit IFLSR incorporates a read sequencer SQS and a memory interface circuit MIF.

The bus state controller BSTC notifies the read circuit IFLSR of a request for initialization according to an input signal such as a power-on reset signal through a data line 17. According to this notification, the read sequencer SQS sends an instruction to the memory interface circuit MIF and reads the data in a predetermined address order successively. The read data is sent to the address translation circuit ACON where a selector W-SEL3 determines the registers to store it and the data is stored in the register groups 60*a* and 60*b*.

(7) Bus and Power Switching Circuit

Figure 6:
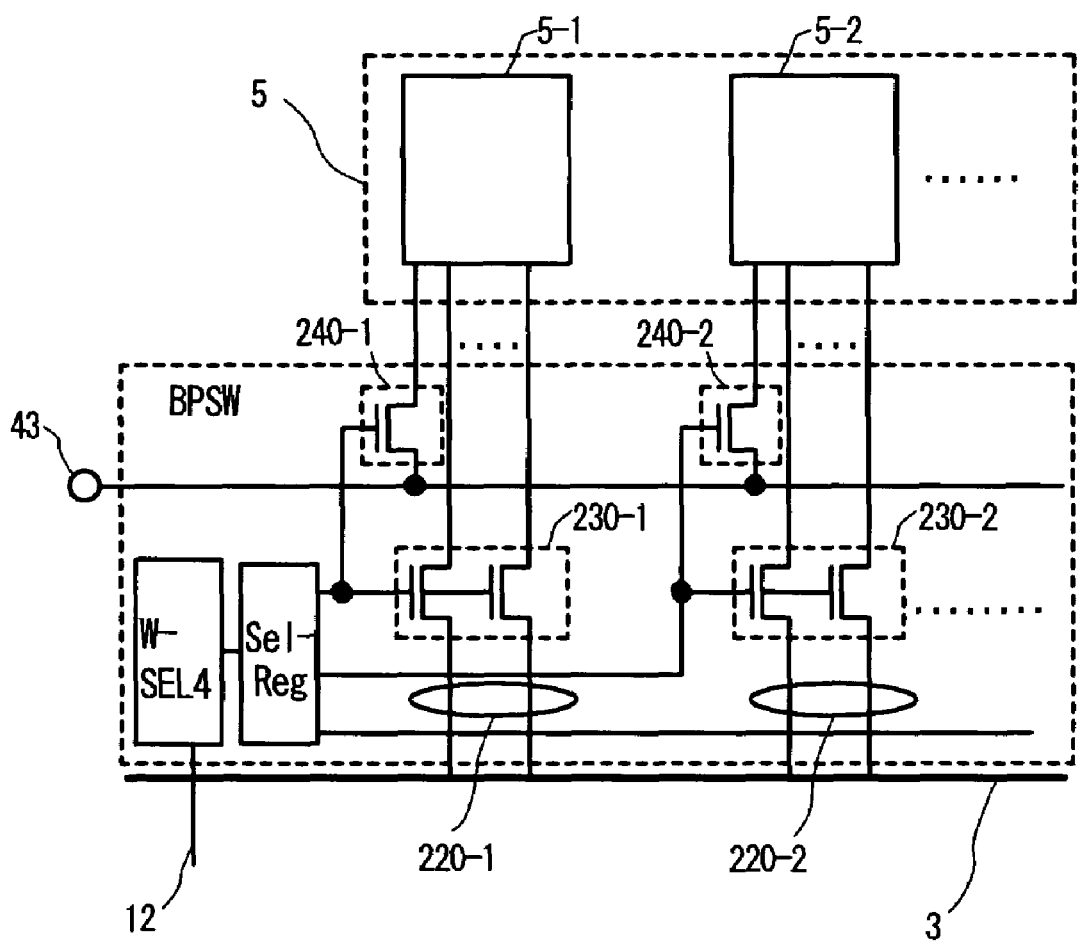
FIG. 6 shows the configuration of a bus and power switching circuit BPSW.

It is desirable that various functional modules be incorporated in the peripheral LSI 33 to cope with various systems. However, some of the incorporated functional modules may not be used. Therefore, waste of electric power caused by current flows to modules not in use or malfunctioning should be prevented. FIG. 6 shows a switching circuit which disconnects a module not in use from a bus and turns off the power to the module. Although the peripheral bus 3 is connected with the module as the connection bus in the example shown in FIG. 6, operation of the circuit is the same when the internal bus 4 is connected.

The switching circuit BPSW has switch elements 240 between a power supply line 43 and functional modules, and switch elements 230 between the bus 3 and functional modules. Switch elements 230-1 and 240-1 for a functional module 5-1 are controlled by a first control signal while switch elements 230-2 and 240-2 for a functional module 5-2 are controlled by a second control signal.

When a control signal activates a switch element, data transfer between a functional module and the peripheral bus becomes possible, the power is supplied and the functional module becomes active. On the other hand, when a control signal inactivates the switch element, data transfer between the functional module and the peripheral bus becomes impossible, there is no power supply and the module becomes inactive. A register Sel-Reg stores such control signals where a control signal for activating a switch element is stored as 1 and a control signal for inactivating it is stored as 0.

As described above, module activation/inactivation is controlled according to the register Sel-Reg. The activation/inactivation data is stored in the on-chip flash memory IFLS. It is read by the read circuit IFLSR when the peripheral LSI 33 is initialized, and written into the register Sel-Reg. Initialization takes place as mentioned above.

A preferred embodiment of the present invention has been so far explained but the invention may be embodied in other forms. In the example shown in FIG. 2, the CPU 27 and peripheral LSI 33 are mounted on a board. However, they may be mounted on different boards. For example, it is also possible to mount the CPU 27 on a first board and the peripheral LSI 33 on a second board, connect the first and second boards by a routing layer and seal them as a package.

Furthermore, a nonvolatile memory or a volatile memory with power backup may be used in place of the on-chip flash memory IFLS. A nonvolatile memory which may be used here is an ultraviolet ray erasable EPROM or fuse. It is also acceptable that such a memory is provided as an external chip instead of being built in the peripheral LSI 33.

According to the present invention, control signals (address information for the flexible BSC 22 and functional module selection information for the bus and power supply switching circuit BPSW) are stored in the on-chip flash memory IFLS, which permits the use of the same peripheral LSI 33 in various systems. It is desirable that writing into the on-chip flash memory IFLS be done in the form of a wafer (pre-chip stage) before a probing test. This eliminates the need for connection of a pin in the package to apply a high voltage for writing into the on-chip flash memory IFLS and thus prevents writing after packaging. In testing the peripheral LSI according to the present invention, the functional module selected by the bus and power supply switching circuit BPSW should be tested but testing of other functional modules may be omitted.

What is claimed is:

1. A semiconductor integrated circuit device comprising:
    a CPU related to a first memory space;
    a peripheral LSI related to a second memory space;
    a CPU bus connected between the CPU and the peripheral LSI and related to the first memory space; and
    an I/O bus connected to the peripheral LSI and related to the second memory space;
    wherein the peripheral LSI comprises:
        an address translation circuit;
        a nonvolatile memory to store address information indicating a relationship between an address of the first memory space and an address of the second memory space;
        a CODEC circuit to compress and uncompress video data;
        a first protocol decode and generation circuit connecting to a first bus connected to the first memory space; and
        a second protocol decode and generation circuit connecting to a second bus connected to the second memory space;
        wherein the address translation circuit is connected to the first and second protocol decode and generation circuits and comprises:
            a register, and
            an address calculation circuit,
                wherein, when the semiconductor integrated circuit device is initialized, the register reads the address information from the nonvolatile memory;
    wherein, when the CPU acts as a bus master to access the second memory space, the first protocol decode and generation circuit receives a first address in the first memory space and sends the first address to the address calculation circuit, the address calculation circuit translates the first address into a second address in the second memory space from the address information stored in the register, and the address calculation circuit sends the second address to the second protocol decode and generation circuit;
    wherein, when the peripheral LSI acts as a bus master to access the first memory space, the second protocol decode and generation circuit receives a third address in the second memory space and sends the third address to the address calculation circuit, the address calculation circuit translates the third address into a fourth address in the first memory space from the address information stored in the register, and the address calculation circuit sends the fourth address to the first protocol decode and generation circuit;
    wherein the CODEC circuit in the peripheral LSI receives compressed first video data from the CPU bus, uncompresses the compressed first video data into uncompressed first video data, and transfers the uncompressed first video data to the I/O bus;
    wherein the CODEC circuit in the peripheral LSI receives second video data from the I/O bus, compresses the second video data into compressed second video data, and transfers the compressed second video data to the CPU bus; and
    wherein the semiconductor integrated circuit device further comprises:
    a first memory;
    a second memory;
    a flash memory; and
    an LCD controller;
    wherein the first memory and the flash memory are connected to the CPU bus; and
    wherein the second memory and the LCD controller are connected to a camera.

2. The semiconductor integrated circuit device according to claim 1, wherein the address information is stored in the nonvolatile memory when a probing test is conducted on the semiconductor integrated circuit device.

3. A semiconductor integrated circuit device comprising:
    a CPU related to a first memory space;
    a peripheral LSI related to a second memory space;
    a CPU bus connected between the CPU and the peripheral LSI and related to the first memory space; and
    an I/O bus connected to the peripheral LSI and related to the second memory space;
    wherein the peripheral LSI comprises:
        an address translation circuit;
        a nonvolatile memory;
        a CODEC circuit to compress and uncompress video data;
        a first protocol decode and generation circuit connecting to a first bus connected to the first memory space; and
        a second protocol decode and generation circuit connecting to a second bus connected to the second memory space;
        wherein the address translation circuit is connected to the first and second protocol decode and generation circuits and comprises:
            a register, and
            an address calculation circuit,
        wherein the nonvolatile memory stores a first start address in a first memory range belonging to the first memory space and a second start address in a second memory range belong to the second memory space;
        wherein the second memory range is allocated to the first memory range;
        wherein, when the semiconductor integrated circuit device is initialized,
        the register reads the first start address and the second start address from the nonvolatile memory;
    wherein, when the CPU acts as a bus master to access the second memory space, the first protocol decode and generation circuit receives a first address in the first memory space and sends the first address to the address calculation circuit, the address calculation circuit translates the first address into a second address in the second memory space from the address information stored in the register, and the address calculation circuit sends the second address to the second protocol decode and generation circuit;
    wherein, when the peripheral LSI acts as a bus master to access the first memory space, the second protocol decode and generation circuit receives a third address in the second memory range and sends the third address to the address calculation circuit, the address calculation circuit translates the third address into a fourth address in the first memory range from the first start memory address, the second start memory address, and the third address which are stored in the register, and the address calculation circuit sends the fourth address to the first protocol decode and generation circuit,
    wherein the CODEC circuit in the peripheral LSI receives compressed first video data from the CPU bus, uncompresses the compressed first video data into uncompressed first video data, and transfers the uncompressed first video data to the I/O bus;
    wherein the CODEC circuit in the peripheral LSI receives second video data from the I/O bus, compresses the second video data into compressed second video data, and transfers the compressed second video data to the CPU bus; and wherein the semiconductor integrated circuit device further comprises:
a first memory;
a second memory;
a flash memory; and
an LCD controller;
wherein the first memory and the flash memory are connected to the CPU bus; and
wherein the second memory and the LCD controller are connected to a camera.

4. The semiconductor integrated circuit device according to claim 3:
wherein the address calculation circuit translates the third address into the fourth address by adding the first start address to the third address and subtracting the second start address.

5. The semiconductor integrated circuit device according to claim 3:
wherein the nonvolatile memory further stores a first address width of the first memory range;
wherein the address translation circuit further comprises an address selection circuit and an interrupt circuit;
wherein, when the peripheral LSI acts as a bus master to access the first memory space, the address selection circuit decides whether or not the first address belongs to the second memory range; and
wherein the address selection circuit outputs an error signal if the first address does not belong to the second memory range.

6. The semiconductor integrated circuit device according to claim 3:
wherein the nonvolatile memory stores a third start address in a third memory range belonging to the first memory space and a fourth start address in a fourth memory range belonging to the second memory space;
wherein the fourth memory range is allocated to the third memory range;
wherein, when the semiconductor integrated circuit device is initialized, the register reads the third start address and the fourth start address from the nonvolatile memory; and
wherein, when a second CPU acts as a bus master to access the second memory space, the first protocol decode and generation circuit receives a fifth address in the third memory range and sends the fifth address to the address calculation circuit, the address calculation circuit translates the fifth address into a sixth address in the fourth memory range from the third start memory address, the fourth start address, and the fifth address which are stored in the register, and the address calculation circuit sends the sixth address to the second protocol decode and generation circuit.

7. A semiconductor integrated circuit device according to claim 1, wherein the address translation circuit is part of a flexible bus controller which is separate from the CPU.

8. A semiconductor integrated circuit device according to claim 3, wherein the address translation circuit is part of a flexible bus controller which is separate from the CPU.

9. A semiconductor integrated circuit device according to claim 7, wherein said flexible bus controller further comprises said first and second protocol decode and generation circuits.

10. A semiconductor integrated circuit device according to claim 8, wherein said flexible bus controller further comprises said first and second protocol decode and generation circuits.

11. A semiconductor integrated circuit device comprising:
a CPU related to a first memory space;
a peripheral LSI related to a second memory space;
a CPU bus connected between the CPU and the peripheral LSI and related to the first memory space; and
an I/O bus connected to the peripheral LSI and related to the second memory space;
wherein the peripheral LSI is separate from the first CPU, and is adapted to transfer data between said first CPU and a peripheral device, said peripheral LSI comprising:
an address translation circuit;
a nonvolatile memory to store address information indicating a relationship between an address of the first memory space and an address of the second memory space;
a CODEC circuit to compress and uncompress video data;
a first protocol decode and generation circuit connecting to a first bus connected to the first memory space; and
a second protocol decode and generation circuit connecting to a second bus connected to the second memory space;
wherein the address translation circuit is connected to the first and second protocol decode and generation circuits and comprises:
a register, and
an address calculation circuit,
wherein, when the CPU acts as a bus master to access the second memory space, the first protocol decode and generation circuit receives a first address in the first memory space and sends the first address to the address calculation circuit, the address calculation circuit translates the first address into a second address in the second memory space from the address information stored in the register, and the address calculation circuit sends the second address to the second protocol decode and generation circuit;
wherein the CODEC circuit in the peripheral LSI receives compressed first video data from the CPU bus, uncompresses the compressed first video data into uncompressed first video data, and transfers the uncompressed first video data to the I/O bus;
wherein the CODEC circuit in the peripheral LSI receives second video data from the I/O bus, compresses the second video data into compressed second video data, and transfers the compressed second video data to the CPU bus; and
wherein the semiconductor integrated circuit device further comprises:
a first memory;
a second memory;
a flash memory; and
an LCD controller;
wherein the first memory and the flash memory are connected to the CPU bus; and
wherein the second memory and the LCD controller are connected to a camera.

12. A semiconductor integrated circuit device according to claim 11, wherein the peripheral LSI further comprised a flexible bus controller which includes said address translation circuit and said first and second protocol decode and generation circuits.

* * * * *